United States Patent

Howard et al.

[11] Patent Number: 6,103,612
[45] Date of Patent: Aug. 15, 2000

[54] ISOLATED INTERCONNECT STUDS AND METHOD FOR FORMING THE SAME

[75] Inventors: Bradley J. Howard, Boise, Id.; David L. Dickerson, Mishawaka, Ind.

[73] Assignee: Micron Technology, Inc., Boise, Id.

[21] Appl. No.: 09/145,373

[22] Filed: Sep. 2, 1998

[51] Int. Cl.[7] .............................................. H01L 21/3205
[52] U.S. Cl. .......................... 438/595; 438/639; 438/672; 438/675; 438/696
[58] Field of Search .................................. 438/595, 639, 438/672, 675, 696

[56] References Cited

U.S. PATENT DOCUMENTS

| | | |
|---|---|---|
| 4,859,618 | 8/1989 | Shikata et al. . |
| 5,019,522 | 5/1991 | Meyer et al. . |
| 5,100,838 | 3/1992 | Dennison . |
| 5,122,848 | 6/1992 | Lee et al. . |
| 5,229,326 | 7/1993 | Dennison et al. . |
| 5,470,773 | 11/1995 | Liu et al. . |
| 5,492,853 | 2/1996 | Jeng et al. . |
| 5,496,750 | 3/1996 | Moslehi . |
| 5,496,774 | 3/1996 | Pramanik et al. . |
| 5,516,625 | 5/1996 | McNamara et al. . |
| 5,573,837 | 11/1996 | Roberts et al. . |
| 5,686,357 | 11/1997 | Howard . |
| 5,712,195 | 1/1998 | Chang ...................................... 437/195 |
| 5,801,443 | 9/1998 | Ohno . |
| 5,880,022 | 3/1999 | Lee et al. ................................ 438/639 |

FOREIGN PATENT DOCUMENTS 0 700 080 A2   3/1996   European Pat. Off. .

*Primary Examiner*—Richard Booth
*Assistant Examiner*—David A. Zarneke
*Attorney, Agent, or Firm*—Killworth, Gottman, Hagan & Schaeff, L.L.P.

[57] ABSTRACT

A method for the manufacture of isolated interconnect studs and the structure so produced is provided. The method includes: providing a semiconductor device including a first semiconductor structure having an upper surface and a second semiconductor structure having an upper surface, the first semiconductor structure having a sidewall and the second semiconductor structure having a sidewall, the sidewalls of the semiconductor structures defining a trench therebetween; forming a conformal layer of a spacer material on the first semiconductor structure and the second semiconductor structure including the respective sidewalls thereof; etching the layer of spacer material to remove the layer of spacer material from the upper surfaces of the semiconductor structures and to cause the layer of spacer material to become recessed along the sidewalls of the first semiconductor structure and the second semiconductor structure; forming a layer of a conductive material in the trench; and etching the layer of conductive material to form a stud of the conductive material in the trench so that the stud is coplanar with or recessed below the respective surfaces of the semiconductor structures to electrically isolate the stud from areas of electrical activity on the semiconductor device.

13 Claims, 7 Drawing Sheets

ISOLATED INTERCONNECT STUDS AND METHOD FOR FORMING THE SAME

BACKGROUND OF THE INVENTION

As the dimensions of integrated circuits continue to decrease, the planarization of a semiconductor architecture continues to be critical to the successful formation of its topographical features, such as trench isolation and one or more layers of interconnects. Typically, the material used to form the interconnects is deposited in a non-selective manner onto the substrate in a blanket deposition and then is selectively etched to form the conductor pattern. Prior to being etched, the material used to form the interconnect is first masked with a photoresist material.

When a photoresist layer is formed on a layer of interconnect material from which an interconnect stud is to be formed, it is essential that the photoresist layer be formed so that the resultant interconnect studs are properly formed and positioned in the desired trenches. Misalignment of the photoresist layer results in studs being partially formed in the desired trench, being malformed and/or being misaligned. When the studs are partially formed in the trench, malformed and/or misaligned, the semiconductor part being formed is rendered useless and must be discarded.

When an interconnect stud is formed between a pair of interconnect lines, a layer of a dielectric material is typically formed over the interconnect lines to insulate the interconnect lines from the stud. The layer of dielectric material is formed, prior to the interconnect stud being formed, in the trench between the word lines to insulate the word lines from the interconnect stud. This layer of dielectric material is commonly referred to as a "spacer." Spacers are typically formed from materials compatible with a silicon process, such as $SiO_2$ and $Si_3N_4$. Once the spacer is formed on the walls of a trench, the width of the trench narrows. The narrowed trench causes the contact area for the subsequently formed interconnect stud to be smaller and causes the subsequently formed interconnect stud to also be narrower than it would be if no spacer were formed in the trench. Narrow interconnect studs make it difficult to form electrical connections with the studs when subsequent layers of the integrated circuit are formed. To combat this problem, prior art interconnect studs are formed so that a portion of the stud extends above the surface of the adjacent interconnect line or other semiconductor structure.

A prior art semiconductor device 150 is shown in FIG. 8. As shown in FIG. 8, a stud 152 is formed in a trench 154 between a pair of interconnect lines 156. The stud 152 has a head 158 and a body 160. A pair of spacers 162 is formed on the sidewalls of the interconnect lines 156. The trench 154 has a width of $W_T$ and each spacer 162 has a width of $W_S$. As can be seen in FIG. 8, the body 160 of the stud 152 has a width of $W_T-2W_S$, assuming that each spacer 162 has the same width. In other words, the trench 154 is narrowed by two times the width of the spacer 162 and subsequently so is the width of the body 160 of the stud 152. To compensate for the narrowing of the body 160 of the stud 152, the stud 152 is formed so that its head 158 extends above the surface of the semiconductor device 150 and so that its head 158 has a width which exceeds the dimensions of the trench 154. However, by forming the stud 152 to have a head 158 which exceeds the dimensions of the trench 154 and which extends above the surface of the semiconductor device 150, the likelihood of the stud 152 coming into contact with another area of electrical activity on the semiconductor device 150 is increased. Also, by extending the stud 152 above the surface of the semiconductor device 150, it becomes more difficult to planarize the semiconductor device 150.

Thus, a need has arisen in the art for a method which can be used to form interconnect studs without the use of a masking step. By eliminating the masking step, one can more quickly complete the manufacturing process and ensure proper formation and alignment of the interconnect studs in their desired trenches. A need also exists in the art for semiconductor devices which include studs that are isolated from other areas of electrical activity on the semiconductor device. Finally, a need also exists for a method to form interconnect studs in trenches insulated by a spacer so that the interconnect studs have broad electrical contact surfaces.

SUMMARY OF THE INVENTION

The present invention offers a solution to the current needs in the art by providing a method for forming interconnect studs without the use of a masking step. By eliminating the masking step, including the steps of depositing a layer of photoresist material, patterning the layer of photoresist material and removing the layer of photoresist material, the present invention provides a method for more quickly and more accurately manufacturing semiconductor parts. The present invention also provides a method by which interconnect studs can be formed so that they are isolated from other areas of electrical activity on the surface of the semiconductor substrate. Finally, the present invention also provides a method for forming interconnect studs having broad contact surfaces in trenches insulated with a spacer material.

One aspect of the present invention is directed to a method for isolating interconnect studs. The method comprises the steps of: providing a semiconductor device including a first semiconductor structure having an upper surface and a second semiconductor structure having an upper surface, the first semiconductor structure having a sidewall and the second semiconductor structure having a sidewall, the sidewalls of the semiconductor structures defining a trench therebetween; forming a conformal layer of a spacer material on the first semiconductor structure and the second semiconductor structure including the respective sidewalls thereof; etching the layer of spacer material to remove the layer of spacer material from the upper surfaces of the semiconductor structures and to cause the layer of spacer material to become recessed along the sidewalls of the first semiconductor structure and the second semiconductor structure; forming a layer of a conductive material in the trench; and etching the layer of conductive material to form a stud of the conductive material in the trench so that the stud is recessed below the respective surfaces of the semiconductor structures to electrically isolate the stud from areas of electrical activity on the semiconductor device.

Another aspect of the present invention is directed to a method for isolating interconnect studs. The method comprises the steps of: providing a semiconductor device including a semiconductor substrate, a first semiconductor structure formed over the semiconductor substrate and a second semiconductor structure formed over the semiconductor substrate, the first semiconductor structure and the second semiconductor structure each having an upper surface and each including at least a conductive layer formed over the semiconductor substrate and an insulative layer formed on the conductive layer, each of the first semiconductor structure and the second semiconductor structure also having a sidewall, the sidewalls of the first and second semiconductor structures defining a trench therebetween; forming a conformal layer of a spacer material on at least the first semiconductor structure, the second semiconductor structure, and the sidewalls; etching the layer of spacer material to remove the layer of spacer material from the upper surfaces of the first semiconductor structure and the second semiconductor structure and to expose at least a portion of the insulative layers along the sidewalls of the first semiconductor structure and the second semiconductor structure; forming a layer of a conductive material on the semiconductor device; and etching the layer of conductive material to form a stud of the conductive material in the trench, the stud having a top surface which extends no higher than being coplanar with the surfaces of the semiconductor structures to electrically isolate the stud from areas of electrical activity on the semiconductor substrate.

Desirably, the step of etching the conductive material to form a stud includes the step of monitoring a concentration of an etchant gas to determine the endpoint of the etching step. If the concentration of the etchant is monitored, the step of monitoring the concentration of the etchant gas includes the step of discontinuing the etching after the concentration of the etchant gas increases from a first substantially constant concentration to a second substantially constant concentration. Desirably, the concentration of the etchant gas is monitored by optical emission spectrometry. Alternatively, the step of etching the conductive material to form a stud includes the step of monitoring a concentration of a product gas to determine the endpoint of the etching step. If the concentration of the product gas is monitored, the step of monitoring the concentration of the product gas includes the step of discontinuing the etching after the-concentration of the product gas decreases from a first substantially constant concentration to a second substantially constant concentration. Again, the concentration of the product gas may be monitored by optical emission spectrometry.

Still another aspect of the present invention is directed to a method for forming a semiconductor structure. This method comprises the steps of: providing a semiconductor device having a surface and having a trench which extends from the surface into the semiconductor device, the trench being defined by a bottom surface and a pair of sidewalls; forming a conformal layer of a spacer material on the surface of the semiconductor device, on the bottom surface, and on the sidewalls; etching the layer of spacer material to cause the layer of spacer material to be recessed along the sidewalls of the trench; depositing a layer of a conductive material on the semiconductor device such that the layer of a conductive material fills the trench and covers at least a portion of the surface of the semiconductor substrate; and etching the layer of conductive material to form a stud in the trench, the stud having a surface which is substantially coplanar with the surface of the semiconductor device.

Yet another aspect of the present invention is directed to a method for forming a semiconductor device. The method comprises the steps of: providing a semiconductor substrate having a first interconnect line and a second interconnect line formed thereon, the first interconnect line and the second interconnect line each having a surface and a sidewall, the sidewalls of the first interconnect line and the second interconnect line defining a trench therebetween; forming a conformal layer of a spacer material on the semiconductor substrate; etching the layer of spacer material to recess the layer of spacer material along the sidewalls of the first interconnect line and the second interconnect line to expose a portion of the first interconnect line and the second interconnect line; forming a layer of a conductive material on the semiconductor substrate by a blanket deposition process so that the trench is filled with the conductive material and at least a portion of the surfaces of the interconnect lines is covered by the conductive material; and etching the layer of conductive material to form a stud of conductive material in the trench, the stud having a surface which is recessed below the surfaces of the first interconnect line and the second interconnect line.

Still yet another aspect of the present invention is directed to a semiconductor device. The semiconductor device is formed on a semiconductor substrate. A first interconnect line is formed over the semiconductor substrate. The first interconnect line has a sidewall and a surface. A second interconnect line is also formed over the semiconductor substrate. The second interconnect line also has a sidewall and a surface. The sidewall of the first interconnect line and the sidewall of the second interconnect line define a trench therebetween. A conformal layer of a spacer material is formed on the sidewall of the first interconnect line and on the sidewall of the second interconnect line. The spacer material is recessed from the surface of the first interconnect line to expose a portion of the sidewall of the first interconnect line. The spacer material is also recessed from the surface of the second interconnect line to expose a portion of the sidewall of the second interconnect line. A stud occupies the trench such that the stud has a first portion which spans from the exposed portion of the sidewall of the first interconnect line to the exposed portion of the sidewall of the second interconnect line and a second portion of the stud which extends between the layers of the spacer material. The first portion of the stud has a width greater than the second portion of the stud. The stud also has a surface which is recessed below the surfaces of the first interconnect line and the second interconnect line.

Another aspect of the present invention is directed to a semiconductor device. The semiconductor device is formed on a semiconductor substrate having a surface. A first interconnect line is formed over the surface of the semiconductor substrate. The first interconnect line includes at least one layer of a conductive material formed over the semiconductor substrate and a layer of an insulative material formed on the layer of conductive material. The first interconnect line also has a sidewall and a surface. A second interconnect line is formed over the surface of the semiconductor substrate. The second interconnect line includes at least one layer of a conductive material formed over the semiconductor substrate and a layer of an insulative material formed on the layer of conductive material. The second interconnect line has a sidewall and a surface. A conformal layer of a spacer material is formed on the sidewall of the first interconnect line and the sidewall of the second interconnect line. The spacer material is recessed from the surface of the first interconnect line exposing at least a portion of the layer of insulative material of the first interconnect line and the spacer material is recessed from the surface of the second interconnect line exposing at least a portion of the layer of insulative material of the second interconnect line. A stud is formed in the trench. The stud contacts the spacer material such that the stud has a first portion which spans between the exposed portions of the layers of insulative material and a second portion which extends between the layers of spacer material. The first portion of the stud has a width greater than the second portion of the stud. Desirably, the stud has a surface which is recessed below the surfaces of the first interconnect line and the second interconnect line.

Still another aspect of the present invention is directed to a semiconductor device. The semiconductor device is formed on a semiconductor substrate. A first interconnect line is formed over the semiconductor substrate. The first interconnect line includes a surface and a sidewall. A second interconnect line is also formed over the semiconductor substrate. The second interconnect line includes a surface and a sidewall. The sidewall of the second interconnect line and the sidewall of the first interconnect line define a trench therebetween. A first layer of a spacer material is formed on the sidewall of the first interconnect line. The first layer of spacer material exposes at least a portion of the first interconnect line. A second layer of a spacer material is formed on the sidewall of the second interconnect line. The second layer of spacer material exposes at least a portion of the second interconnect line. A stud is formed in the trench. The stud has a surface which is substantially coplanar with the surfaces of the first interconnect line and the second interconnect line. A first portion of the stud formed between the exposed portions of the interconnect lines is wider than a second portion of the stud formed between the first layer of the spacer material and the second layer of the spacer material.

Yet another aspect of the present invention is directed to a method for forming an isolated stud for a semiconductor device. The method comprises the steps of: providing a semiconductor substrate; forming a layer of polysilicon on the semiconductor substrate; forming a layer of a first conductive material on the layer of polysilicon; forming a layer of an insulative material on the layer of conductive material; etching the layers of the polysilicon, the first conductive material and the insulative material to form at least two interconnect lines, each of the interconnect lines having an upper surface and a sidewall, and the sidewalls of the interconnect lines defining a trench therebetween; forming a conformal layer of a spacer material over the semiconductor substrate and on the interconnect lines; etching the layer of spacer material to remove the spacer material from the upper surfaces of the interconnect lines and to recess the layer of the spacer material below the upper surfaces of the interconnect lines so that at least a portion of the layer of insulative material is exposed; depositing a blanket layer of a second conductive material over the interconnect lines; and etching the blanket layer of the second conductive material to form a stud in the trench, the stud having a surface which is substantially coplanar with the surfaces of the interconnect lines and the stud being isolated from contact with other conductive structures by the interconnect lines.

Still yet another aspect of the present invention is directed to a method for forming a memory array. The memory array comprises a plurality of memory cells arranged in rows and columns with each of the plurality of memory cells comprising at least one field effect transistor. The method comprises the steps of: providing a semiconductor substrate; forming sources, drains and gates for each of the field effect transistors; forming, over the semiconductor substrate, a plurality of interconnect lines which link the field effect transistors together, each of the interconnect lines having a surface and a portion of the interconnect lines being adjacent, the adjacent interconnect lines defining trenches therebetween; forming a conformal layer of a spacer material on at least a portion of the interconnect lines; etching the layer of spacer material to recess the layer of spacer material below the surfaces of the interconnect lines so that at least a portion of the layer of dielectric material is exposed; forming a blanket layer of a conductive material on the semiconductor substrate; and etching the blanket layer of conductive material to form studs in the trenches, the studs being recessed below the surfaces of the adjacent interconnect lines to isolate the studs from electrical activity on the semiconductor substrate.

Another aspect of the present invention is directed to a method for fabricating a wafer. The method comprises the steps of: providing a wafer including a semiconductor substrate; forming a repeating series of active and passive devices on each of a plurality of individual die over the semiconductor substrate; forming, over the semiconductor substrate, a plurality of interconnect lines to interconnect the active and passive devices, each of the interconnect lines including at least one layer of a conductive material formed over the semiconductor substrate and a layer of an insulative material formed on the layer of conductive material, and each of the interconnect lines having a sidewall and a surface, the sidewalls of adjacent interconnect lines forming trenches therebetween; forming a conformal layer of a spacer material on at least a portion of the interconnect lines; etching the layer of spacer material to cause the layer of spacer material to become recessed along the sidewalls of the interconnect lines to expose a portion of the insulative material; forming a conformal layer of an electrically conductive material on the semiconductor substrate over the interconnect lines; and etching the layer of electrically conductive material to form studs of the electrically conductive material in the trenches so that the studs are recessed below the surfaces of the interconnect lines to electrically isolate the studs from areas of electrical activity on the wafer.

Still another aspect of the present invention is directed to a memory array. The memory array is formed on a semiconductor substrate. A plurality of memory cells arranged in rows and columns are formed on the semiconductor substrate. Each of the plurality of memory cells includes at least one field effect transistor. Each of the field effect transistors includes a source, a drain and a gate. A plurality of interconnect lines which link the field effect transistors together are formed over the semiconductor substrate. Each of the interconnect lines has a surface. A portion of the interconnect lines are adjacent. The adjacent interconnect lines define trenches therebetween. A layer of a dielectric material is formed on the surfaces of each of the interconnect lines. A layer of a spacer material is formed on at least a portion of the interconnect lines. The layer of spacer material is formed so that it is recessed below the surfaces of the interconnect lines to expose at least a portion of the layer of dielectric material. Conductive studs are formed in at least a portion of the trenches. The studs are recessed below the surfaces of the adjacent interconnect lines to isolate the studs from electrical activity on the semiconductor substrate.

Another aspect of the present invention is directed to a semiconductor wafer. The wafer is formed on a semiconductor substrate. A repeating series of active and passive devices is formed on each of a plurality of individual die over the semiconductor substrate. A plurality of interconnect lines is formed over the semiconductor substrate to interconnect the active and passive devices. Each of the interconnect lines includes at least one layer of a conductive material formed on the semiconductor substrate and a layer of an insulative material formed over the layer of conductive material. Each of the interconnect lines has a sidewall and a surface. The sidewalls of adjacent interconnect lines form trenches therebetween. A layer of a spacer material is formed on at least a portion of the interconnect lines. The layer of spacer material is recessed along the sidewalls of the interconnect lines to expose a portion of the insulative material. Studs of electrically conductive material are formed in at least a portion of the trenches so that the studs are recessed below the surfaces of the interconnect lines to electrically isolate the studs from areas of electrical activity on the wafer.

Objects and advantages of the present invention will be apparent from the following detailed description, the accompanying drawings and the appended claims.

DETAILED DESCRIPTION OF THE INVENTION

For the purposes of the present application, the preposition "on" refers to formation of a first layer or element in contact with the surface of a second particular element or layer, while "over" refers to a formation of a first layer or element above the surface of and/or in contact with the surface of a second particular element or layer. Use of the word "over" does not preclude intermediate elements or layers being formed between the first element or layer and the second element or layer.

Figure 1:
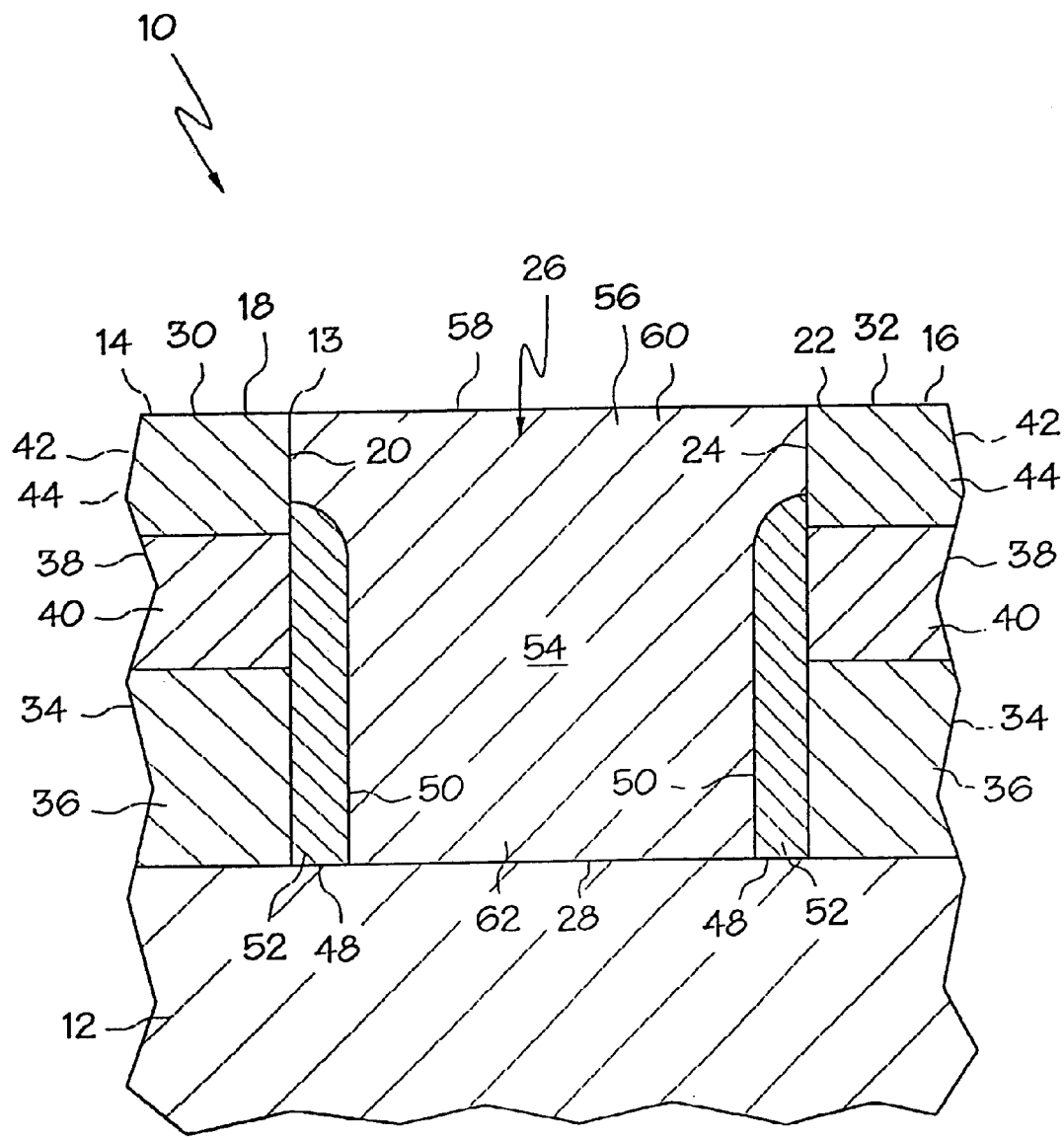
FIG. 1 presents a cross sectional view of a semiconductor device formed by the method of the present invention.

FIG. 1 presents a cross sectional view of a semiconductor device 10 of the present invention. The semiconductor device 10 includes a substrate 12 on which the components of the semiconductor device 10 are formed and the semiconductor device 10 has a surface 13. A first semiconductor structure 14 and a second semiconductor structure 16 are formed over the substrate 12. The first semiconductor structure 14 has an upper surface 18 and a sidewall 20. Likewise, the second semiconductor structure 16 has an upper surface 22 and a sidewall 24. The first semiconductor structure 14 and the second semiconductor structure 16 define a trench 26 therebetween. The trench 26 is formed by the sidewall 20 of the first semiconductor structure 14 and the sidewall 24 of the second semiconductor structure 16. The trench 26 is also defined by a bottom surface 28 which may be, as shown in FIG. 1, a portion of the substrate 12. The trench 26 provides access to layers below the surface 13 of the semiconductor device 10 and extends from the surface 13 of the semiconductor device 10 into the semiconductor device 10. The first semiconductor structure 14 is desirably a first interconnect line 30 and the second semiconductor structure 16 is desirably a second interconnect line 32. The first interconnect line 30 and the second interconnect line 32 connect various active and passive devices which are positioned on the substrate 12 and which make up the semiconductor device 10. The first interconnect line 30 and the second interconnect line 32 can be word lines, digit lines, or other interconnects, buses or studs.

If the first semiconductor structure 14 is an interconnect line 30 and if the second semiconductor structure 16 is an interconnect line 32, each of the interconnect lines 30 and 32 is formed from at least a layer 34 of a first conductive material 36 and, desirably, a layer 38 of a second conductive material 40. Desirably, the layer 38 of the second conductive material 40 is formed on the layer 34 of first conductive material 36. A layer 42 of an insulative material 44 is formed on either the layer 34 of the first conductive material 36 or the layer 38 of the second conductive material 40. Regardless of whether the layer 38 of second conductive material 40 is present, the layer 42 of the insulative material 44 is formed as the topmost layer of the interconnect lines 30 and 32. If the first and second semiconductor structures 14 and 16 are interconnect lines 30 and 32, then the layer 42 of insulative material 44 is commonly referred to as a cap.

A spacer 48 is formed on each of the sidewalls 20 and 24 of the first and second semiconductor structures 14 and 16, respectively. The spacer 48 is formed from a layer 50 of a spacer material 52 which is deposited conformally over the surface 13 of the semiconductor device 10 and then etched, as will be described below in connection with the discussion of FIGS. 2 and 3, so that the spacer 48 is recessed along the sidewalls 20 and 24 of the first and second semiconductor structures 14 and 16, respectively. The spacer 48 is also recessed below the surfaces 18 and 22 of the first semiconductor structure 14 and the second semiconductor structure 16, respectively. If the semiconductor structures 14 and 16 are interconnect lines 30 and 32, respectively, then, desirably, the spacer 48 is recessed so that at least a portion of the layer 42 of insulative material 44 is exposed and so that any layers of conductive material, such as layer 34 and layer 38, remain covered by the spacer material 52.

A stud 54 formed from an electrically conductive material 56 occupies the trench 26. The stud 54 has a surface 58. The surface 58 of the stud 54 stands substantially coplanar with but no higher than coplanar with the surfaces 18 and 22 of the first semiconductor structure 14 and the second semiconductor structure 16, respectively. Desirably, the surface 58 of the stud 54 is recessed below the surfaces 18 and 22 of the first semiconductor structure 14 and the second semiconductor structure 16, respectively. Typically, the surface 58 of the stud 54 is recessed from about 100 Å to about 1000 Å below the surfaces 18 and 22 of the first semiconductor structure 14 and the second semiconductor structure 16, respectively. Because the surface 58 of the stud 54 is coplanar with or recessed below the surfaces 18 and 22 of the first semiconductor structure 14 and the second semiconductor structure 16, respectively, the stud 54 is isolated from other areas of electrical activity on the semiconductor device 10.

Figure 8:
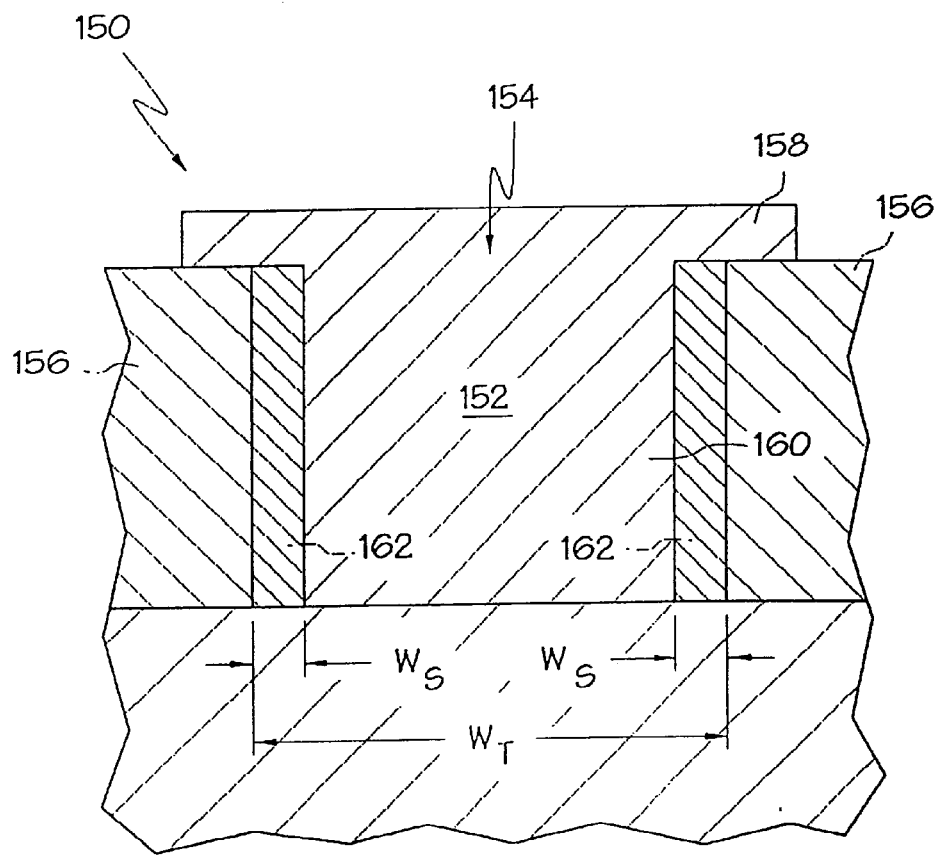
FIG. 8 presents a cross sectional view of a prior art interconnect stud.

With continued reference to FIG. 1, the recessed spacer 48 causes a portion of the trench 26 in which the stud 54 is formed to be narrower but does not cause the width of the entire trench 26 to be decreased in size. Consequently, a first, upper portion 60 of the stud 54 has a width which is greater than a width of a second, lower portion 62 of the stud 54. By recessing the spacer 48 along the sidewalls 20 and 24 of the first semiconductor structure 14 and the second semiconductor structure 16, respectively, the first portion 60 of the stud 54 spans the entire width of the trench 26. Because the first portion 60 of the stud 54 has a width equal to the width of the trench 26, the stud 54 is wider than a conventionally formed stud which is formed in a trench in which the sidewalls are completely covered with a spacer material, see FIG. 8. Referring back to FIG. 1, the recessed spacer 48 insulates the stud 54 from both the layer 34 of conductive material 36 and the layer 38 of conductive material 40 of both the first interconnect line 30 and the second interconnect line 32 while allowing the first portion 60 to be wider than the second portion 62 to provide a broad contact surface 58 for the stud 54.

The substrate 12 is formed from any material currently in use in the art which is used to form substrates for semiconductor devices such as semiconductor device 10. Exemplary materials useful to form the substrate 12 include, but are not limited to, doped or undoped silicon, doped or undoped polycrystalline silicon, silicon dioxide, gallium arsenide, gallium phosphide, indium arsenide and indium phosphide.

The first conductive material 36 and the second conductive material 40 can be any material which conducts an electric current. The first conductive material 36 and the second conductive material 40 can be formed from the same or different materials. Exemplary materials useful for forming the conductive materials 36 and 40 include, but are not limited to, polycrystalline silicon, aluminum, copper, aluminum-copper alloys, aluminum-titanium alloys, gold, tungsten, titanium nitride, tungsten nitride, titanium silicides ($TiSi_x$) and tungsten silicides ($WSi_x$). Desirably, the first conductive material 36 is polycrystalline silicon and the material 40 is either $TiSi_x$ or $WSi_x$.

The insulative material 44 can be any material used to form insulative and/or dielectric layers for semiconductor devices, such as semiconductor device 10. Materials which can be used to form the insulative material 44 include, but are not limited to, tetraethyl orthosilicate (TEOS), nitrides, and oxides. Desirably, the insulative material 44 is silicon dioxide.

The spacer material 52 can be any material used to form dielectric and/or insulating layers for semiconductor devices, such as semiconductor device 10. Materials which can be used to form the spacer material 52 include, but are not limited to, tetraethyl orthosilicate (TEOS), nitrides, and oxides. Desirably, the spacer material 52 is formed from a material which is different from that used to form the layer 42 of insulative material 44. The spacer material 52 is desirably formed from a material which is different from that used to form the layer 42 of insulative material 44 so that the layer 50 of spacer material 52 can be etched without damaging the layer 42 of insulative material 44. Desirably, the spacer material 52 is silicon nitride.

The conductive material 56 can be any material which conducts an electric current. Exemplary materials useful for forming the conductive material 56 include, but are not limited to, polycrystalline silicon, aluminum, copper, tungsten, aluminum-copper alloys, aluminum-titanium alloys, gold, titanium suicides ($TiSi_x$) and tungsten suicides ($WSi_x$). Desirably, the stud 54 of conductive material 56 is formed from polycrystalline silicon.

Figure 2:
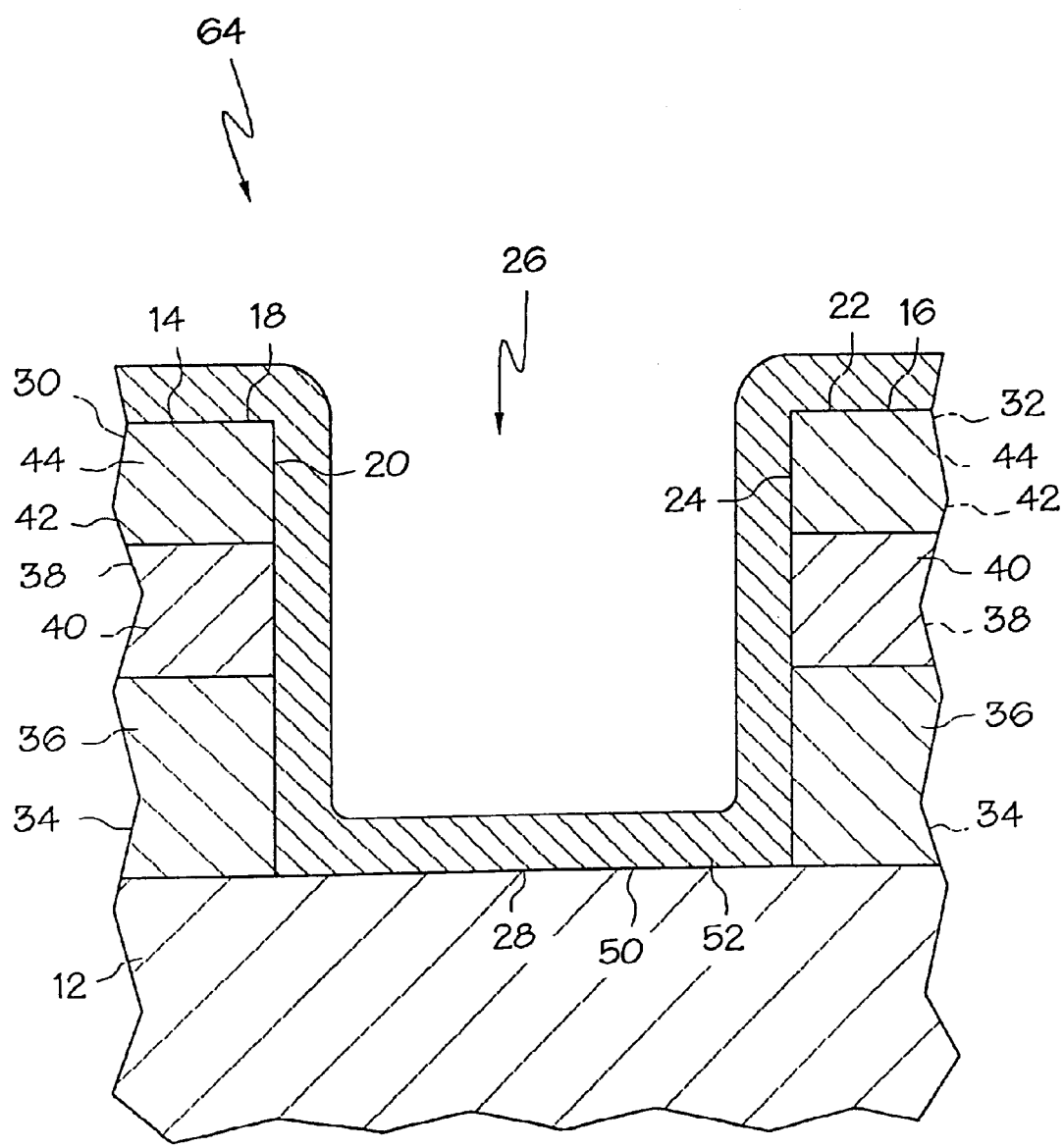
FIG. 2 presents a cross sectional view of a step in the method of the present invention showing a conformal layer of dielectric material being formed on a precursor of the semiconductor device.
Figure 3:
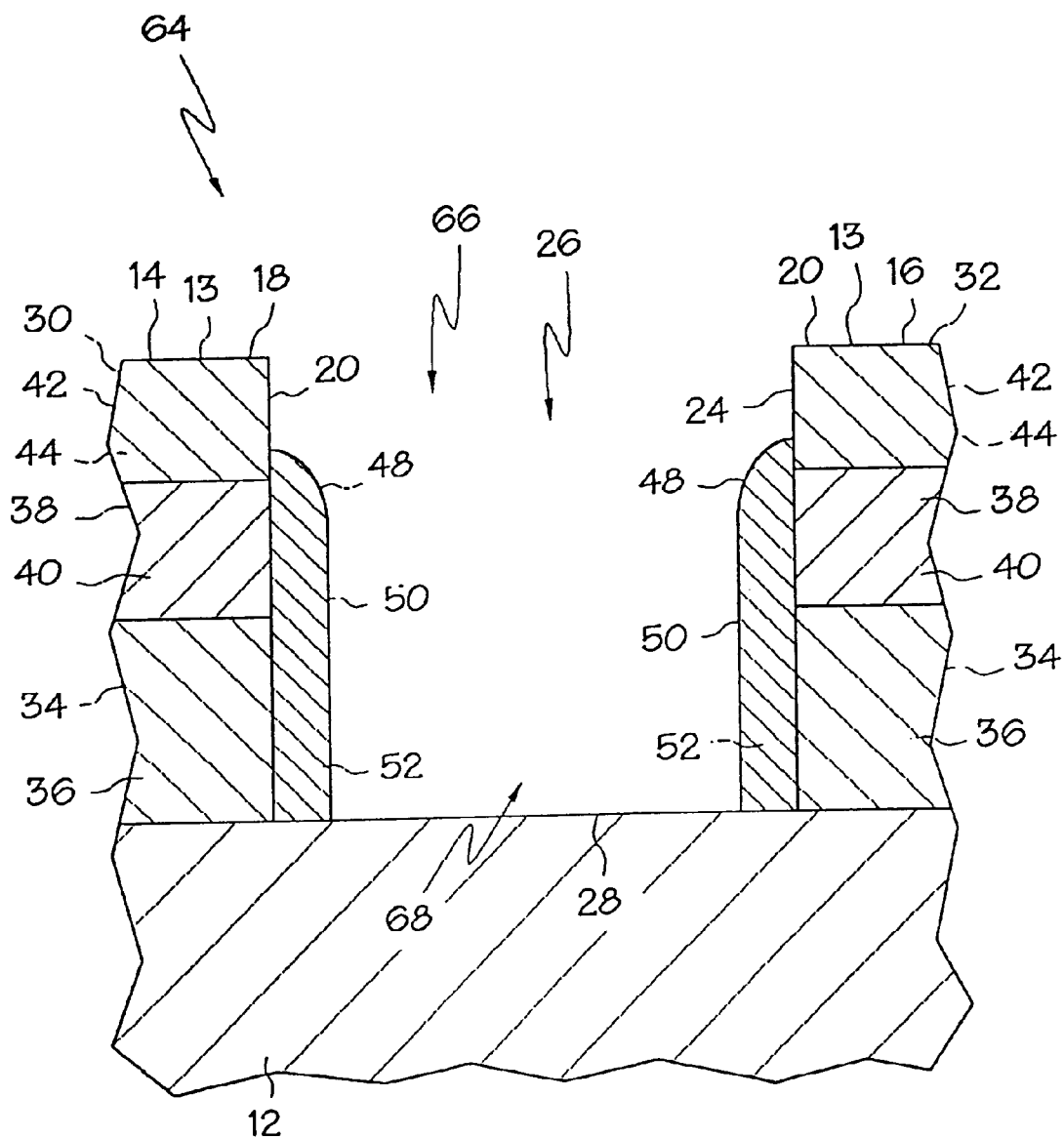
FIG. 3 presents a cross sectional view of a step in the method of the present invention showing the layer of dielectric material after being etched according to the method the present invention.
Figure 4:
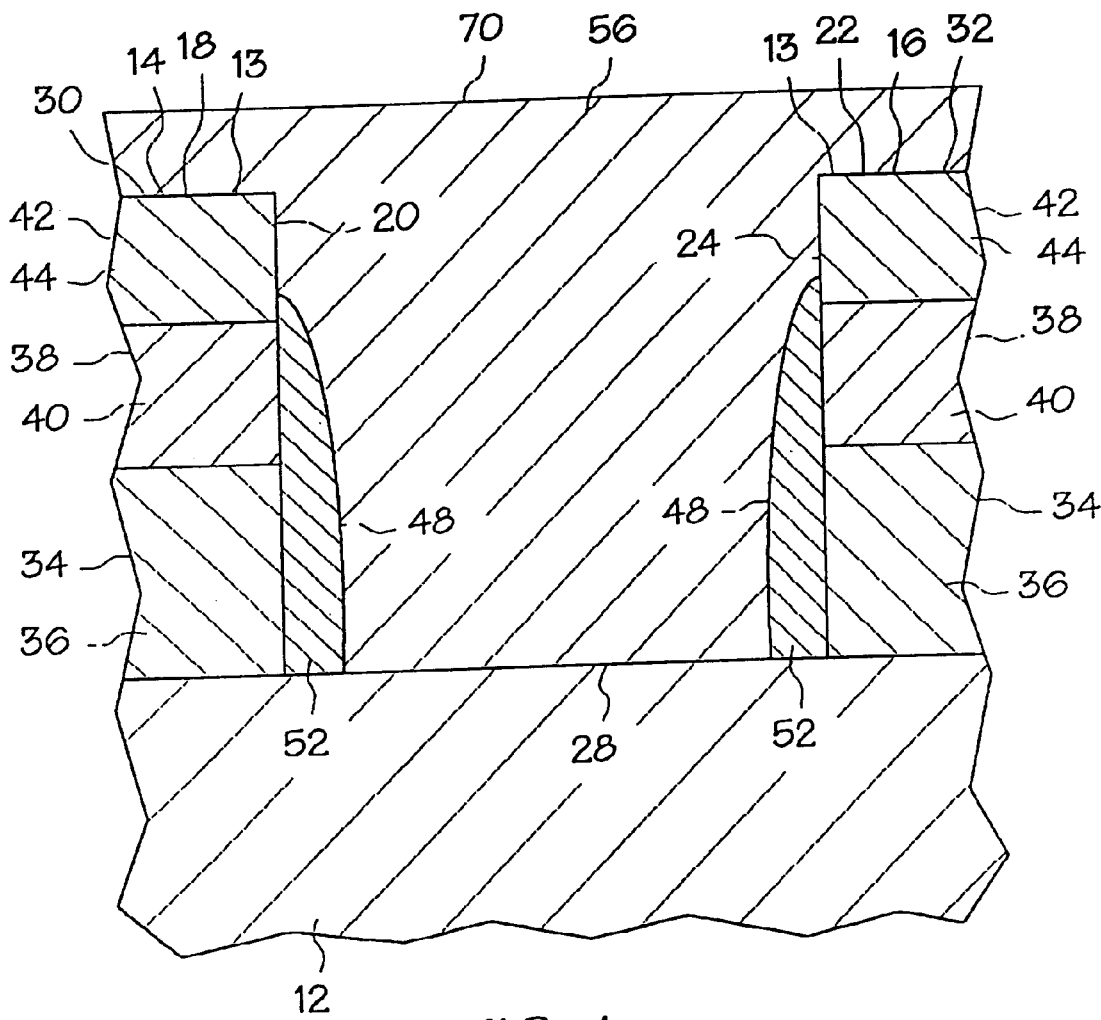
FIG. 4 presents a cross sectional view of a step in the method of the present invention showing the precursor after a blanket layer of a conductive material has been deposit thereon.

A process for forming the semiconductor device 10 is illustrated in FIG. 2 through FIG. 4. With reference to FIG. 2, a precursor 64 of the semiconductor device 10 is shown in cross section. If the first semiconductor structure 14 and the second semiconductor structure 16 are interconnect lines 30 and 32, respectively, then the interconnect lines 30 and 32 are first formed by forming the layer 34 of the first conductive material 36 over the substrate 12. The layer 34 is formed by any conventional method currently in use in the art, such as, for example, thermal oxidation, chemical vapor deposition (CVD), low pressure chemical vapor deposition (LP CVD), plasma enhanced chemical vapor deposition (PE CVD), metalorganic chemical vapor deposition (MO CVD), and sputtering. Next, if it is employed, the layer 38 of the second conductive material 40 is desirably formed on the layer 34 of first conductive material 36 by any conventional method currently in use in the art such as any of the previously referenced methods. The layer 42 of the insulative material 44 is then formed on the layer 38 of the second conductive material 40 by any conventional method currently in use in the art such as any of the previously referenced methods. If the layer 38 is not present, then the layer 42 is formed on the layer 34.

With continued reference to FIG. 2, to form the first interconnect line 30 and the second interconnect line 32, the layers 34, 38 and 42 are masked and etched by a conventional masking and etching process. In the process of forming the first interconnect line 30 and the second interconnect line 32, the trench 26 is also formed while the sidewalls 18 and 22 are being defined during the etching process.

Next, the layer 50 of spacer material 52 is formed as a conformal layer over the substrate 12, the first semiconductor structure 14 and the second semiconductor structure 16. The layer 50 of spacer material 52 is formed by any method currently in use in the art to deposit such a layer. Useful methods are listed above. As stated above, the spacer material 52 is desirably formed from a material different from that used to form the layer 42 of insulative material 44.

With reference to FIG. 3, once the layer 50 of spacer material 52 has been formed on the substrate 12, the layer 50 is etched to form the spacers 48. To form the spacers 48, the layer 50 of spacer material 52 is anisotropicaly etched using a gas plasma etch, an ion beam etch, or a reactive ion etch. Desirably, the layer 50 of spacer material 52 is subjected to a reactive ion etch. The layer 50 of spacer material 52 is etched so that the layer 50 becomes recessed from the surface 13 of the precursor 64 and so that at least a portion of each of the sidewalls 20 and 24 of the semiconductor structures 14 and 16 is exposed. To recess the spacers 48, the layer 40 is etched to the point at which the layer 50 of spacer material 52 has been removed from the horizontal surfaces 18 and 22 of the semiconductor structures 14 and 16, respectively. Once the layer 50 of spacer material 52 has been removed from the surfaces 18 and 22, the layer 50 is then over etched for a period of time sufficient to etch the layer 50 at least a portion of the way down the sidewalls 20 and 24 of the semiconductor structures 14 and 16, respectively. By recessing the spacers 48 down the sidewalls 20 and 24 of the semiconductor structures 14 and 16, respectively, the trench 26 is provided with a first opening portion 66 which is wider than a second opening portion 68. Referring back to FIG. 1, the first opening portion 66 will contain the first portion 60 of the stud 54 while the second opening portion 68 will contain the second portion 62 of the stud 54.

When the semiconductor structures 14 and 16 are interconnect lines 30 and 32, the spacer 48 is etched so that at least a portion of each of the layers 42 of insulative material 44 are exposed. To recess the spacers 48, the layer 40 is etched to the point at which the layer 50 of spacer material 52 has been removed from the horizontal surfaces 18 and 22 of the interconnect lines 30 and 32, respectively. Once the layer 50 of spacer material 52 has been removed from the surfaces 18 and 22, the layer 50 is then over etched for a period of time sufficient to etch the layer 50 to expose a portion of each of the layers 42 of insulative material 44 of the interconnect lines 30 and 32. The etching of the layer 50 of spacer material 52 is discontinued before either of the layer 34 of the first conductive material 36 or the layer 38 of the second conductive material 40 is exposed. Thus, the stud 54 is insulated from the conductive portions of the first and second interconnect lines 30 and 32 while still having its first portion 60 be wider than its second portion 62 to provide the stud 54 with a broad contact surface 58.

As shown in FIG. 4, after etching the layer 50 of spacer material 52 to form the spacers 48, a layer 70 of the conductive material 56 is formed on the surface 13 of the precursor 64 by a blanket deposition process. The layer 70 is deposited by any conventional method currently used to deposit layers of conductive material onto semiconductor substrates and structures.

To form the stud 54, the layer 70 of conductive material 56 is desirably etched by placing the precursor 64 in a reactive ion etcher. The reactive ion etcher includes a cathode for which a power source creates a radio frequency (RF) of 13.56 MHz, while controlling the introduction of etchant gases. The walls of the reactor are grounded to allow for a return RF path. The RF power source creates a plasma condition in the chamber, thereby allowing for the creation of charged particles or ions. Due to the physics of the RF powered electrode, a direct current self-bias voltage condition is created at the location of the precursor 64. This self-bias condition directs the charged particles or ions toward the precursor 64 in a direction perpendicular to the surface of the precursor 64. A useful reactive ion etcher is an Applied Materials 5000 Series available from Applied Materials of Santa Clara, Calif.

Typical parameters for etching the layer 70 of conductive material 56 to form the stud 54, using an Applied Materials 5000 Series apparatus, are as follows:

| RF Power: | about 100 watts to about 400 watts; |
|---|---|
| Pressure: | about 80 mtorr to about 180 mtorr; and |
| Etchant: | about 50 sccm to about 100 sccm $Cl_2$ and about 0 sccm to about 30 sccm HBr. |

No specific ratio of $Cl_2$ to HBR is required. The parameters should be selected to achieve a uniform and controllable etch. Other Cl and Br containing gases may be used. While fluorine-containing gases may also be used, such etchants have a tendency to accelerate the etch, making it more difficult to control. Thus, the use of fluorine-containing gases is not preferred. Desirably, an RF Power of about 250 watts; a pressure of about 130 mtorr; and about 80 sccm of $Cl_2$ and about 15 sccm HBR are used to etch the layer 70 of conductive material 56 to form the stud 54.

The layer 70 of conductive material 56, as shown in FIG. 4, is etched so that the surface 58 of the stud 54 is no higher than coplanar with the surfaces 18 and 22 of the first semiconductor structure 14 and the second semiconductor structure 16, as shown in FIG. 1. Desirably, the layer 70 of conductive material 56 is etched so that the surface 58 of the stud 54 is recessed below the surfaces 18 and 22 of the first semiconductor structure 14 and the second semiconductor structure 16.

Figure 5:
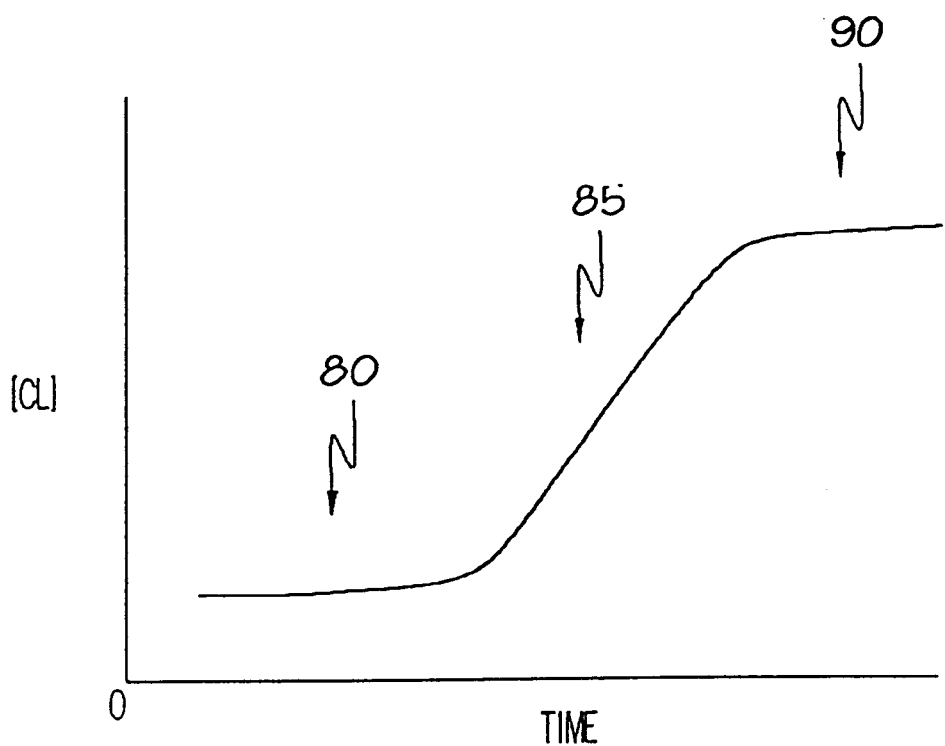
FIG. 5 presents a graph illustrating how the end point of the stud etch of the present invention is determined.

The process of etching the layer 70 of conductive material 56 to form the stud 54 is desirably monitored with an optical emission spectrometer (OES). The OES monitors the concentration of one of the etchant gases as the etching is being carried out by monitoring the intensity of an emission line of that particular etchant gas. For example, if the etchant gas is chlorine, then an emission line of 470.5 nm is monitored. As shown in FIG. 5, the concentration of the etchant gas is monitored as the layer 70 of conductive material 56 is removed from the horizontal surfaces of the precursor 64, see 80. At the point 80, the concentration of the etchant gas remains substantially constant. Once the layer 70 has been removed from the surface 13 of the precursor 64, the concentration of the etchant gas increases, see 85, for a period of time as less of the etchant gas is consumed in the etching process. The concentration of the etchant gas will increase to a second point at which it will level off, see 90. Approximately at point 90, the etching of the surface 58 of the stud 54 begins. At the point 90, the concentration of the etchant gas remains substantially constant and would remain substantially constant until recessed to the top of the spacer where the concentration would increase slightly. In the process of the present invention, the etching is desirably continued past the point 85 for a period of time to etch the surface 58 of the stud 54 below the surfaces 18 and 22 of the first semiconductor structure 14 and the second semiconductor structure 16, respectively.

By etching the layer 70 of conductive material 56 so that the surface 58 of the stud 54 is no higher than the surfaces 18 and 22 of the first semiconductor structure 14 and the second semiconductor structure 16, respectively, the stud 54 is isolated from contact with any other areas of electrical activity, such as other active devices, passive devices or stringers, on the surface 13 of the semiconductor device 10. Further, by etching the stud 54 so that its surface 54 is no higher than the surfaces 18 and 22, the dimensions of the stud 54 are defined by the dimensions of the trench 26 and no photolithography step is required to properly form the stud 54.

Once the semiconductor device 10 has been formed, it can be subjected to further processing, if desired. This further processing may include the formation of an additional layer or layers including one or more active and/or passive devices on the surface 13 of the semiconductor device 10. The semiconductor device 10 may have a passivation layer formed thereon.

Figure 6:
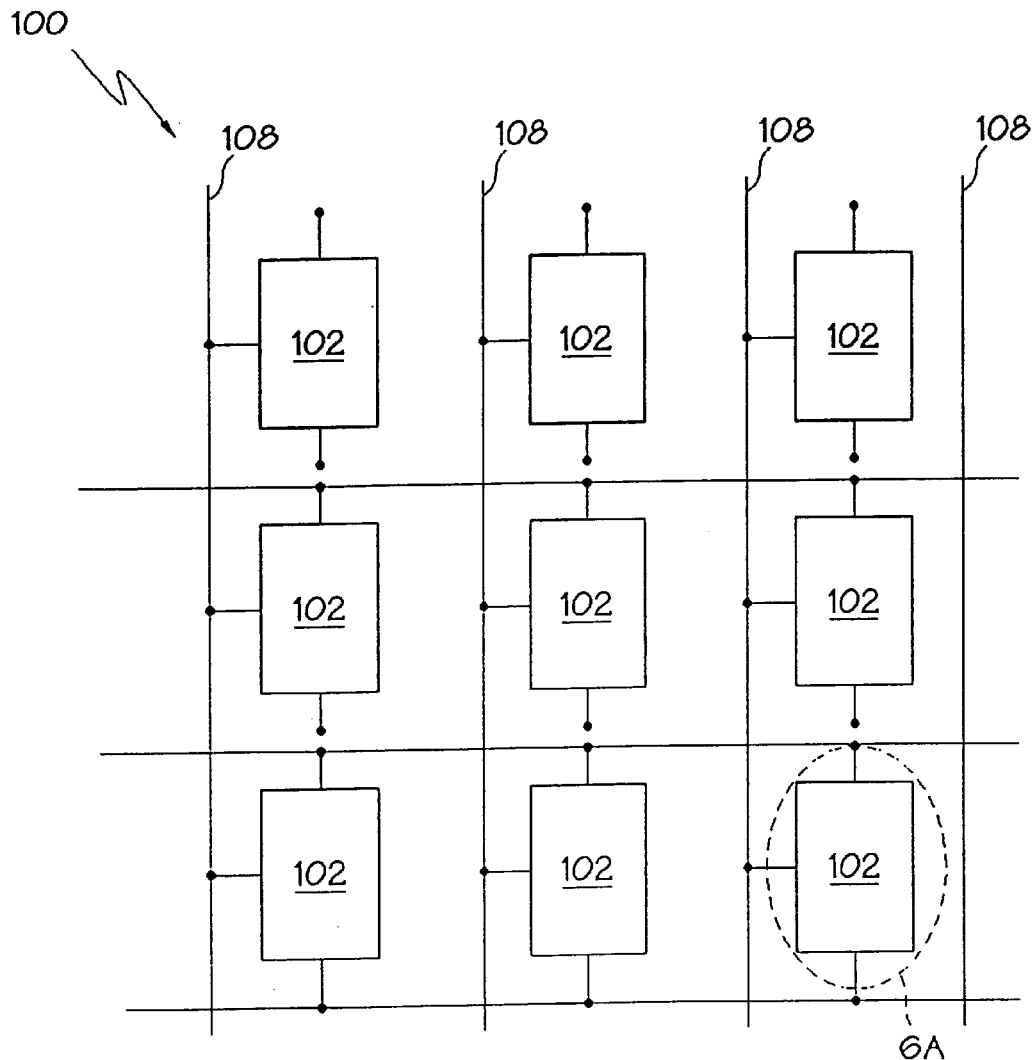
FIGS. 6 and 6A present a schematic view of a memory cell formed by the method of the present invention.
Figure 6A:
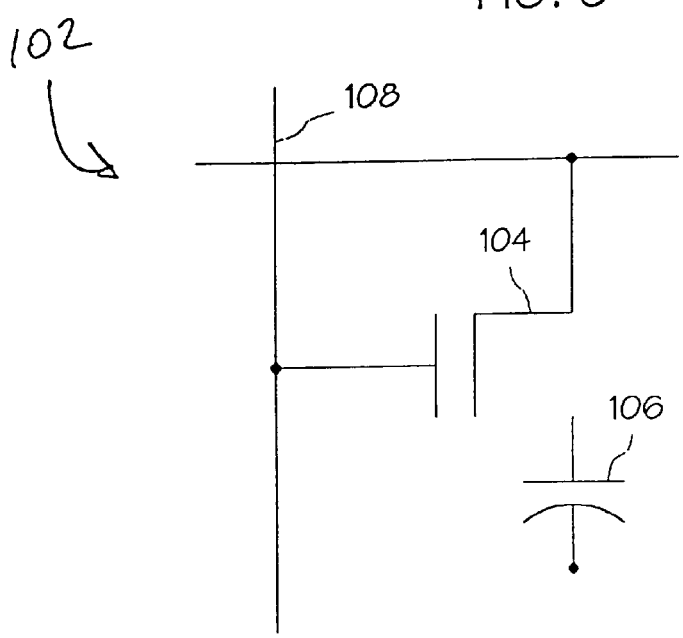

The process of the present invention may be used to form a typical memory array, such as, for example, a static random access memory (SRAM) array or a dynamic random access memory (DRAM) array 100, which is shown in FIG. 6. The DRAM array 100 comprises a plurality of memory cells 102 arranged in rows and columns. As shown in FIG. 6A, each of the memory cells 102 includes at least one field effect transistor 104 and one capacitor 106. Each field effect transistor 104 is coupled to a capacitor 106, both of which are formed by methods known in the art. The gate of the field effect transistor 104 is coupled to a word line 108 via an interconnect structure, such as the interconnect lines 30 and 32, described above. The process described above in conjunction with FIGS. 1–5 can be used to form studs, such as stud 54, during the fabrication of the memory array 100, and also to form interconnect lines, such interconnect lines 30 and 32. It should be apparent that other devices such as transistors, bipolar transistors, resistors, capacitors and the like, may be interconnected by the interconnect lines 30 and 32 and may be formed on semiconductor device 10.

Figure 7:
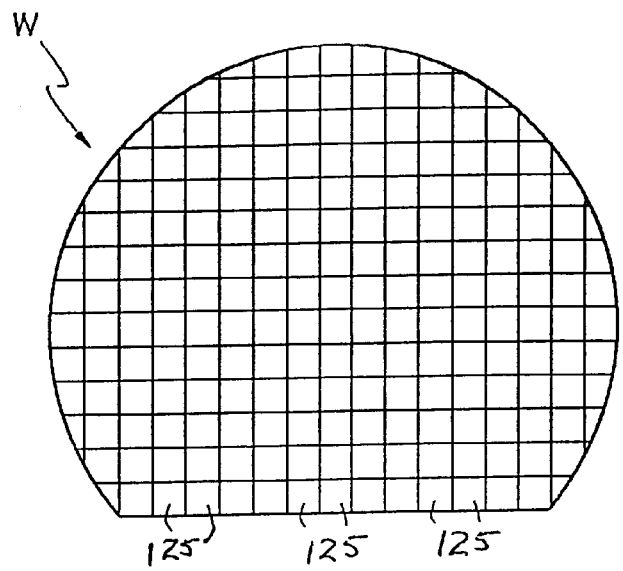
FIG. 7 presents a schematic view of a wafer formed by the method of the present invention.

The process of the present invention may also used in the fabrication of a wafer W, as is shown in FIG. 7. The wafer W includes a plurality of individual die 125 formed on a semiconductor substrate, such as substrate 12. Wafer masks (not shown) are used to apply a desired circuit structure on each of the individual die 125. The desired circuit structure may comprise any of the above described structures, e.g., the DRAM array 100 or an SRAM array. The wafer W is processed using standard wafer fabrication techniques. The active and passive devices on the wafer are connected to each other by interconnect lines such as interconnect lines 30 and 32. Again, the process described above in conjunction with FIGS. 1–5 can be used form studs, such as studs 44 on the wafer W.

Having described the invention in detail and by reference to preferred embodiments thereof, it will be apparent that modifications and variations are possible without departing from the scope of the invention which is defined in the appended claims.

What is claimed is:

1. A method for isolating interconnect studs comprising the steps of:

providing a semiconductor device including a first semiconductor structure having an upper surface and a second semiconductor structure having an upper surface, said first semiconductor structure having a sidewall and said second semiconductor structure having a sidewall, said sidewalls of said semiconductor structures defining a trench therebetween;

forming a conformal layer of a dielectric spacer material on said first semiconductor structure and said second semiconductor structure including the respective sidewalls thereof;

etching said layer of dielectric spacer material to remove said layer of dielectric spacer material from said upper surfaces of said semiconductor structures and to cause said layer of dielectric spacer material to become recessed along said sidewalls of said first semiconductor structure and said second semiconductor structure;

forming a blanket layer of an electrically conductive material in said trench; and etching said blanket layer of electrically conductive material to form a stud of said electrically conductive material in said trench so that said stud is recessed below said respective surfaces of said semiconductor structures to electrically isolate said stud from areas of electrical activity on said semiconductor device.

2. A method for isolating interconnect studs comprising the steps of:

providing a semiconductor device including a semiconductor substrate, a first semiconductor structure formed over said semiconductor substrate and a second semiconductor structure formed over said semiconductor substrate, said first semiconductor structure and said second semiconductor structure each having an upper surface and each including at least a conductive layer formed over said semiconductor substrate and an insulative layer formed on said conductive layer, each of the first semiconductor structure and the second semiconductor structure also having a sidewall, said sidewalls of said first and second semiconductor structures defining a trench therebetween;

forming a conformal layer of a dielectric spacer material on at least said first semiconductor structure, said second semiconductor structure, and said sidewalls;

etching said layer of dielectric spacer material to remove said layer of dielectric spacer material from said upper surfaces of said first semiconductor structure and said second semiconductor structure and to expose at least a portion of said insulative layers along said sidewalls of said first semiconductor structure and said second semiconductor structure;

forming a blanket layer of a conductive material on said semiconductor device; and etching said blanket layer of conductive material to form a stud of said conductive material in said trench, said stud having a top surface which extends no higher than coplanar with said surfaces of said semiconductor structures to electrically isolate said stud from areas of electrical activity on said semiconductor substrate.

3. The method of claim 2 wherein the step of etching said conductive material to form a stud includes the step of monitoring a concentration of an etchant gas to determine the endpoint of said etching step.

4. The method of claim 3 wherein the step of monitoring said concentration of said etchant gas includes the step of discontinuing said etching after said concentration of said etchant gas increases from a first substantially constant concentration to a second substantially constant concentration.

5. The method of claim 4 wherein said concentration of said etchant gas is monitored by optical emission spectrometry.

6. The method of claim 2 wherein the step of etching said conductive material to form a stud includes the step of monitoring a concentration of a product gas to determine the endpoint of said etching step.

7. The method of claim 6 wherein the step of monitoring said concentration of said product gas includes the step of discontinuing said etching after said concentration of said product gas decreases from a first substantially constant concentration to a second substantially constant concentration.

8. The method of claim 7 wherein said concentration of said product gas is monitored by optical emission spectrometry.

9. A method for forming a semiconductor structure comprising the steps of:

providing a semiconductor device having a surface and having a trench which extends from said surface into said semiconductor device, said trench being defined by a bottom surface and a pair of sidewalls;

forming a conformal layer of a dielectric spacer material on said surface of said semiconductor device and on said bottom surface and said sidewalls;

etching said layer of dielectric spacer material to cause said layer of dielectric spacer material to be recessed along said sidewalls of said trench;

depositing a layer of a conductive material on said semiconductor device such that said layer of a conductive material fills said trench and covers at least a portion of said surface of said semiconductor device; and etching said layer of conductive material to form a stud in said trench, said stud having a surface which is substantially coplanar with said surface of said semiconductor device.

10. A method for forming a semiconductor device comprising the steps of:

providing a semiconductor substrate having a first interconnect line and a second interconnect line formed thereon, said first interconnect line and said second interconnect line each having a surface and a sidewall, said sidewalls of said first interconnect line and said second interconnect line defining a trench therebetween;

forming a conformal layer of a dielectric spacer material on said semiconductor substrate;

etching said layer of dielectric spacer material to recess said layer of dielectric spacer material along said sidewalls of said first interconnect line and said second interconnect line to expose a portion of said first interconnect line and said second interconnect line;

forming a layer of a conductive material on said semiconductor substrate by a blanket deposition process so that said trench is filled with said conductive material and at least a portion of said surfaces of said interconnect lines is covered by said conductive material; and etching said layer of conductive material to form a stud of conductive material in said trench, said stud having a surface which is recessed below said surfaces of said first interconnect line and said second interconnect line.

11. A method for forming an isolated stud for a semiconductor device, said method comprising the steps of:

providing a semiconductor substrate;

forming a layer of polysilicon over said semiconductor substrate;

forming a layer of a first conductive material on said layer of polysilicon;

forming a layer of an insulative material on said layer of conductive material;

etching said layers of said polysilicon, said first conductive material and said insulative material to form at least two interconnect lines, each of said interconnect lines having an upper surface and a sidewall, and said sidewalls of said interconnect lines defining a trench therebetween;

forming a conformal layer of a dielectric spacer material over said semiconductor substrate and over said interconnect lines;

etching said layer of dielectric spacer material to remove said dielectric spacer material from said upper surfaces of said interconnect lines and to recess said layer of said dielectric spacer material below said upper surfaces of said interconnect lines so that at least a portion of said layer of insulative material is exposed;

depositing a blanket layer of a second conductive material over said interconnect lines; and etching said blanket layer of said second conductive material to form a stud in said trench, said stud having a surface which is substantially coplanar with said surfaces of said interconnect lines and said stud being isolated from contact with other conductive structures by said interconnect lines.

12. A method for forming a memory array, said memory array comprising a plurality of memory cells arranged in rows and columns, each of said plurality of memory cells comprising at least one field effect transistor:

providing a semiconductor substrate;

forming sources, drains and gates for each of said field effect transistors;

forming, over said semiconductor substrate, a plurality of interconnect lines which link said field effect transistors together, each of said interconnect lines having a surface and a portion of said interconnect lines being adjacent, said adjacent interconnect lines defining trenches therebetween;

forming a conformal layer of a dielectric spacer material on at least a portion of said interconnect lines;

etching said layer of dielectric spacer material to recess said layer of dielectric spacer material below said surfaces of said interconnect lines so that at least a portion of said layer of dielectric material is exposed;

forming a blanket layer of a conductive material on said semiconductor substrate; and etching said blanket layer of conductive material to form studs in said trenches, said studs being recessed below said surfaces of said adjacent interconnect lines to isolate said studs from electrical activity on said semiconductor substrate.

13. A method for fabricating a wafer comprising the steps of:

providing a wafer including a semiconductor substrate;

forming a repeating series of active and passive devices on each of a plurality of individual die over said semiconductor substrate;

forming, over said semiconductor substrate, a plurality of interconnect lines to interconnect said active and passive devices, each of said interconnect lines including at least one layer of a conductive material formed over said semiconductor substrate and a layer of an insulative material formed on said layer of conductive material, and each of said interconnect lines having a sidewall and a surface, said sidewalls of adjacent interconnect lines forming trenches therebetween;

forming a conformal layer of a dielectric spacer material on at least a portion of said interconnect lines;

etching said layer of dielectric spacer material to cause said layer of dielectric spacer material to become recessed along said sidewalls of said interconnect lines to expose a portion of said insulative material;

forming a blanket conformal layer of an electrically conductive material on said semiconductor substrate over said interconnect lines; and etching said layer of electrically conductive material to form studs of said electrically conductive material in said trenches so that said studs are recessed below said surfaces of said interconnect lines to electrically isolate said studs from areas of electrical activity on said wafer.

* * * * *